(12) United States Patent
Jeong et al.

(10) Patent No.: US 7,932,540 B2
(45) Date of Patent: Apr. 26, 2011

(54) T-GATE FORMING METHOD FOR HIGH ELECTRON MOBILITY TRANSISTOR AND GATE STRUCTURE THEREOF

(75) Inventors: Yoon-Ha Jeong, Kyungsangbuk-do (KR); Kang-Sung Lee, Kyungsangbuk-do (KR); Young-Su Kim, Kyungsangbuk-do (KR); Yun-Ki Hong, Kyungsangbuk-do (KR); Sung-Woo Jung, Kyungsangbuk-do (KR)

(73) Assignees: Postech Foundation, Kyungsangbuk-do (KR); Postech Academy-Industry Foundation, Kyungsangbuk-do (KR)

( * ) Notice: Subject to any disclaimer, the term of this patent is extended or adjusted under 35 U.S.C. 154(b) by 890 days.

(21) Appl. No.: 11/700,946

(22) Filed: Feb. 1, 2007

(65) Prior Publication Data

US 2008/0108188 A1    May 8, 2008

(30) Foreign Application Priority Data

Nov. 3, 2006   (KR) .................. 10-2006-0108497

(51) Int. Cl.
*H01L 29/66* (2006.01)
(52) U.S. Cl. ................... 257/194; 257/E29.249
(58) Field of Classification Search ............ 257/194, 257/E29.246, E29.247, E29.248, E29.249, 257/E29.252, E29.253, E21.403, E21.407; 438/182
See application file for complete search history.

(56) References Cited

U.S. PATENT DOCUMENTS

| | | | | |
|---|---|---|---|---|
| 5,497,015 A | * | 3/1996 | Ishibashi et al. | 257/287 |
| 5,637,899 A | * | 6/1997 | Eimori et al. | 257/347 |
| 5,652,179 A | * | 7/1997 | Strifler et al. | 438/578 |
| 6,037,200 A | * | 3/2000 | Uda et al. | 438/167 |
| 6,255,035 B1 | * | 7/2001 | Minter et al. | 430/312 |
| 2003/0109098 A1 | | 6/2003 | Makiyama et al. | |

(Continued)

FOREIGN PATENT DOCUMENTS

JP        03-191533        8/1991

(Continued)

OTHER PUBLICATIONS

K. S. Lee, Y. S. Kim, K. T. Lee, and Y. H. Jeong , Process for 20 nm T gate on AI 0.25Ga0.75As/In0.2Ga0.8As/GaAs epilayer using two-step lithography and zigzag foot, Department of Electronic and Electrical Engineering, Pohang University of Science and Technology, San 31, Hyoja, Nam-Gu, Pohang, Gyungbuk 790-784, South Korea, pp. 1869-1872.*

*Primary Examiner* — Matthew C Landau
*Assistant Examiner* — Latanya Crawford
(74) *Attorney, Agent, or Firm* — Bacon & Thomas, PLLC (57) ABSTRACT

A T-gate forming method for a high electron mobility transistor includes the steps of: coating a first, a second and a third resist, each having an electron beam sensitivity different from each other, on a semiconductor substrate; performing a first exposure process by using an electron beam on the semiconductor substrate and then selectively developing the third resist; defining a gate head area by selectively developing the second resist to have a developed width wider than that of the third resist; performing a second exposure process by using an electron beam on the semiconductor substrate and then selectively developing the first resist in a bent shape at a temperature lower than in the development of the second and the third steps; and depositing metallic materials on the resists and then removing them to form a T-gate.

4 Claims, 13 Drawing Sheets

U.S. PATENT DOCUMENTS

| | | | |
|---|---|---|---|
| 2004/0152289 A1* | 8/2004 | Makiyama et al. | 438/585 |
| 2004/0168586 A1* | 9/2004 | Bailey et al. | 101/3.1 |
| 2007/0099368 A1* | 5/2007 | Ahn et al. | 438/199 |
| 2007/0164322 A1* | 7/2007 | Smith et al. | 257/256 |
| 2008/0251858 A1* | 10/2008 | Ahn et al. | 257/386 |

FOREIGN PATENT DOCUMENTS

| | | |
|---|---|---|
| JP | 05-181286 | 7/1993 |
| JP | 06-077124 | 3/1994 |
| JP | 2000-216169 | 4/2000 |
| JP | 2003-142500 | 5/2003 |

* cited by examiner

T-GATE FORMING METHOD FOR HIGH ELECTRON MOBILITY TRANSISTOR AND GATE STRUCTURE THEREOF

FIELD OF THE INVENTION

The present invention relates to a method for forming a semiconductor device and a structure thereof; and, more particularly, to a T-gate forming method for a high electron mobility transistor and a gate structure thereof.

BACKGROUND OF THE INVENTION

As well known, in high-speed components such as HEMTs (High Electron Mobility Transistors) which are used in satellite broadcasting receivers, high-speed logical circuits and power modules, a short gate length is required for a quick modulation while a large cross section of a pattern is also required in order to pass a high current therethrough.

Figure 1A:
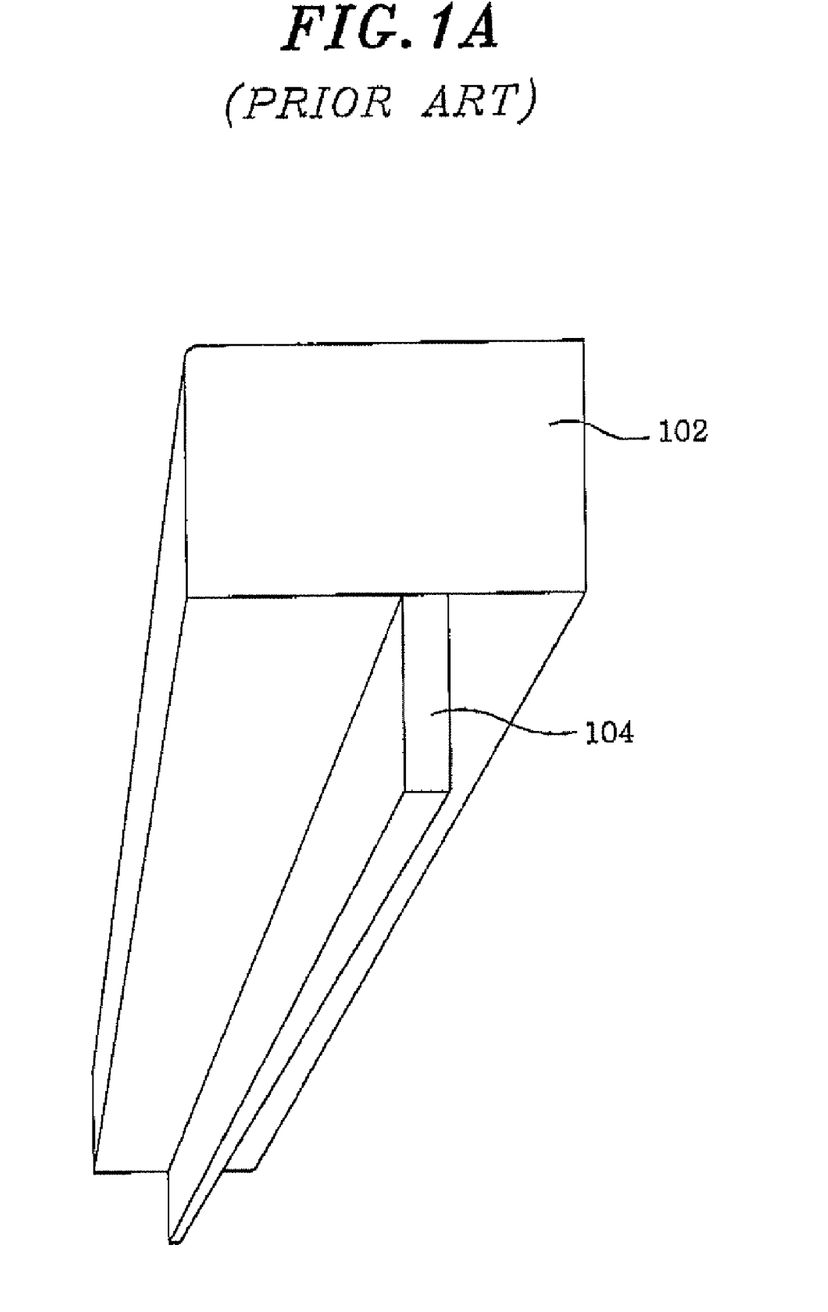
FIGS. 1A and 1B show a general T-gate which is formed according to the conventional method.

From this, T-gates having a cross section of a 'T' shape are widely used in III-V compound semiconductor devices. The T-gate is formed of a gate head 102 and a gate foot 104 as shown in FIG. 1A, and has merits that it can maintain a gate resistance to be low while reducing the width of the gate foot 104.

To fabricate such T-gates with a gate foot width of 50 nm or below, an exposure process of the T-gate (i.e., electron beam lithography) and a process of stably forming the T-gate on a semiconductor substrate after depositing metals thereon are considerably important.

First, in the conventional exposure process of the T-gate having a gate foot width of 50 nm or below, the forward scattering and the gate head exposure have an effect on determining the gate foot definition. Here, increasing an accelerating voltage of an electron beam apparatus reduces the effect of the electron while decreasing sensitivity of the resist formed on the lowest layer reduces the effect of the gate head exposure. Further, the sensitivity of the resist can be reduced by developing it at a low temperature.

In order to fabricate the T-gate with a gate foot width of 50 nm or below by employing such an electron beam exposure process, the exposure process needs to be carried out by using an electron beam with an accelerating voltage of about 100 keV. Therefore, there are drawbacks in that its production cost is high and the semiconductor substrate can be damaged by the high accelerating voltage.

Figure 1B:
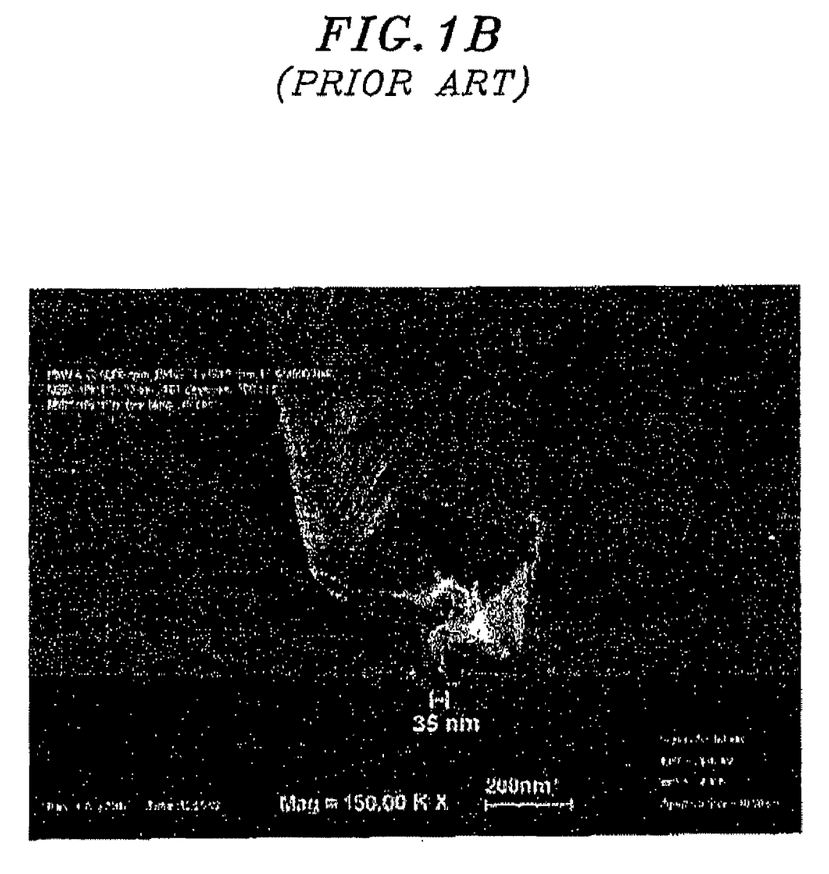

Next, the conventional T-gate having a straight gate foot is fabricated by decreasing the size of the gate foot to 50 nm or below in order to improve its characteristics, without decreasing the size of the gate head to prevent the increase of the gate resistance. However, since such size of the gate foot cannot support the gate head, the T-gate is not stably formed after depositing the metals and removing the resists, thereby resulting in a phenomenon where the T-gate falls to one side as shown in FIG. 1B.

If the T-gate formed in field effect transistors such as the HEMTs falls to one side, the schottky contact characteristics will be deteriorated, and thus, electrical characteristics of the semiconductor device will be degraded.

Accordingly, in the conventional forming process of the T-gate with a gate head having a wide width and a gate foot having a narrow width, the electron beam with a relatively high accelerating voltage is required to be used in the exposure process, and also a phenomenon that the T-gate falls to one side occurs due to the unstable structure of the T-gate. Therefore, there are problems in that the production cost is high and the characteristics of the semiconductor device are deteriorated.

SUMMARY OF THE INVENTION

It is, therefore, an object of the present invention to provide a T-gate forming method for high electron mobility transistors, wherein an exposure process is performed by using an electron beam with a relatively low accelerating voltage; and a gate structure thereof.

Another object of the present invention is to provide a T-gate forming method for high electron mobility transistors, wherein a gate foot of the gate has a transversal cross section of a bent shape to form a stable structure; and a gate structure thereof.

In accordance with one aspect of the present invention, there is provided a T-gate forming method for a high electron mobility transistor, the method including the steps of:

a first step of coating a first resist, a second resist and a third resist, each having an electron beam sensitivity different from each other, on a semiconductor substrate;

a second step of performing a first exposure process by using an electron beam on the semiconductor substrate where the first resist, the second resist and the third resist are coated and then selectively developing the third resist;

a third step of defining a gate head area by selectively developing the second resist to have a developed width wider than that of the third resist;

a fourth step of performing a second exposure process by using an electron beam on the semiconductor substrate where the third resist and the second resist are selectively developed and then selectively developing the first resist in a bent shape at a temperature lower than in the development of the second and the third steps; and a fifth step of depositing metallic materials on the first resist, the second resist and the third resist which are selectively developed and then removing the first resist, the second resist and the third resist to form a T-gate with the gate head and a gate foot.

In accordance with another aspect of the present invention, there is provided a gate structure of a high electron mobility transistor, the gate structure including:

a gate foot formed on a semiconductor substrate; and a gate head, with a width wider than the gate foot, formed on the gate foot, wherein a transversal cross section of the gate foot is of a bent shape.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

FIGS. 2A to 2F are cross sectional views sequentially showing formation of a T-gate through a lithography process by using an electron beam in accordance with the present invention.

Figure 2A:
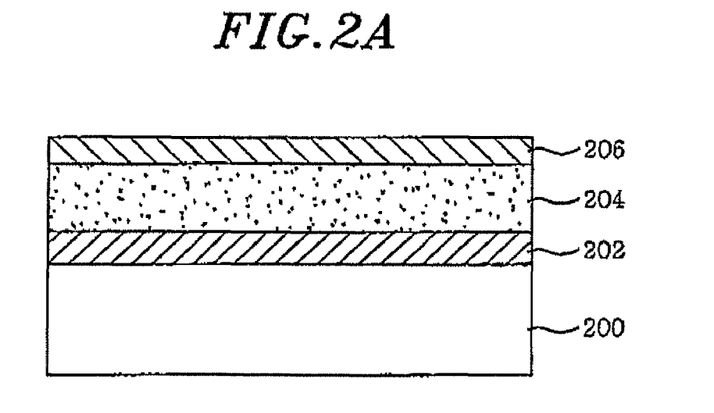
FIGS. 2A to 2F are cross sectional views sequentially showing formation of a T-gate through a lithography process by using an electron beam in accordance with the present invention.

Referring to 2A, a first resist 202, a second resist 204 and a third resist 206 are sequentially coated on a semiconductor substrate 200. For example, a PMMA (Polymethyle Methacrylate) resist is coated in a thickness from 90 nm to 110 nm as the first resist 202, and a PMGI (Poly-Dmethylgutarimide) resist is then coated in a thickness from 450 nm to 550 nm as the second resist 204, and finally a PMMA-MAA (Polymethyle Methacrylate-Methyle Methacrylate) resist is coated in a thickness from 180 nm to 220 nm as the third resist 206. Further, the first resist 202, the second resist 204 and the third resist 206 can be coated, for example, by a spin-coating technique. Hereinafter, such layered structure of the first, the second, and the third resist 202, 204 and 206 will be simply referred to as a "structure".

Figure 2B:
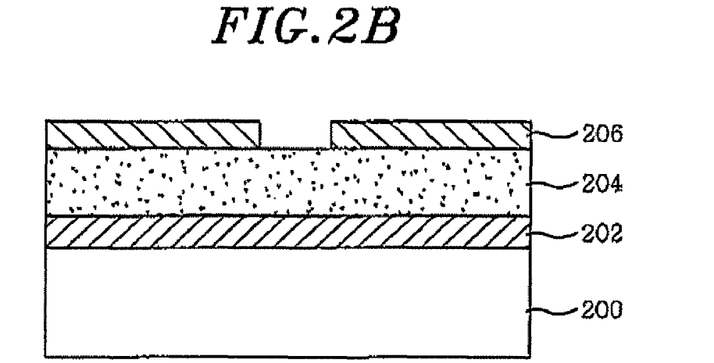

After coating each resist, baking is performed thereto for about 5 minutes at a temperature from 180° C. to 200° C. After this, the structure is cooled by the air for about 10 minutes, and then a first exposure process is carried out. For example, the first exposure process is performed at an energy level of 90 $\mu C/cm^2$ to 100 $\mu C/cm^2$. After finishing the exposure process, the third resist 206 of the PMMA-MAA resist formed on the top of the structure is selectively developed at room temperature by using a developing solution with a ratio of MIBK:IPA being 1:3, as shown in FIG. 2B.

Figure 2C:
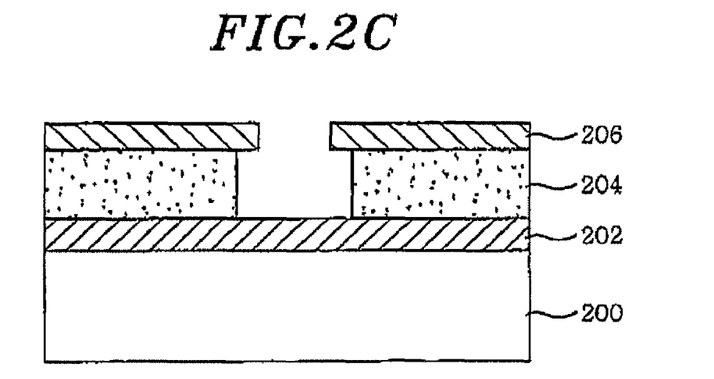

Next, on the semiconductor substrate 200 where the third resist 206 is selectively removed, the second resist 204 of the PMGI resist formed at the middle layer is selectively developed at room temperature by using a developing solution such as a PMGI-101 to define an area where a gate head will be formed, as shown in FIG. 2C. At this time, since the third resist 206 and the second resist 204 have electron beam sensitivities different from each other, the area which is formed after developing the second resist 204 has a wide width though the same energy level of the electron beam is irradiated thereto.

Figure 2D:
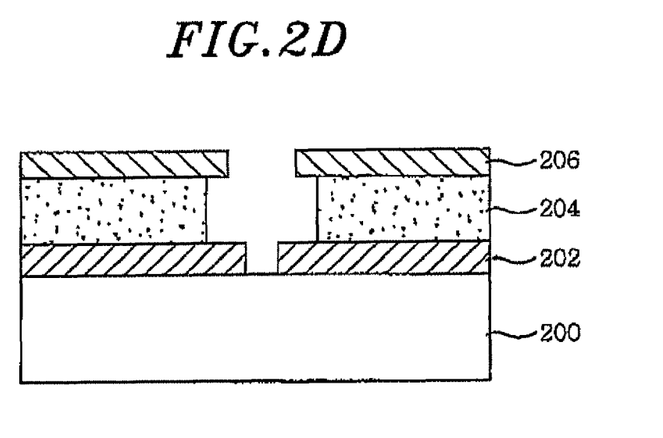

Thereafter, a second exposure process is performed on the semiconductor substrate 200 where the second resist 204 is selectively removed. The second exposure process is performed, for example, at an energy level of 1000 $\mu C/cm^2$ to 4000 $\mu C/cm^2$, on a part of the first resist 202 over which the central portion of the area formed by selectively removing the second resist 204 to form the gate head is located. After that, as shown in FIG. 2D, the first resist 202 of the PMMA resist formed at the lowest layer of the structure is selectively developed at a low temperature from −15° C. to −25° C. by using a developing solution with a ratio of MIBK:IPA being 1:3. At this point, the area where the first resist 202 is selectively removed is defined as a gate foot area of which the width is narrower than that of the gate head area defined in FIG. 2C. Here, the gate foot area having the narrow width can have transversal cross sections of bent shapes such as a patterned shape having trapezoids, where each trapezoid is connected to its two adjacent trapezoids without the base lines; a patterned shape having alternating sharp bends at each apex; a patterned shape having curved bends alternating right and left. The fabricating method of the bent shapes will be described in detail later.

Through these processes, the electron beam is irradiated to the first resist 202 of the PMMA resist (the bottom layer of the structure) which remains after developing the gate head part, so the forward scattering due to the resist can be reduced. Further, the effect of the first exposure process can be decreased because the sensitivity of the first resist 202 of the PMMA resist formed at the lowest layer of the structure is reduced due to a low temperature development.

Figure 2E:
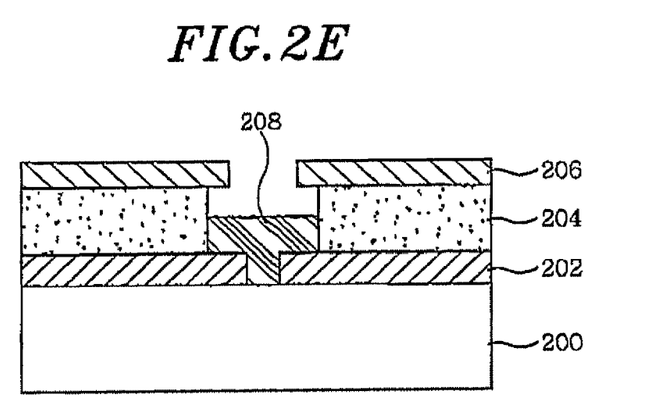

Subsequently, as shown in FIG. 2E, metallic materials are deposited, in the area where the first resist 202, the second resist 204 and the third resist 206 are selectively removed according to their electron beam sensitivities, to form a T-gate 208 with a wide gate head and a narrow gate foot. Herein, the T-gate is formed of multiple layers of the metallic materials by using Ti, Pt and Au, for example, and if Ti, Pt and Au are deposited in sequence, the thickness of Ti, Pt, and Au layer can be, for example, from 25 nm to 35 nm, from 10 nm to 20 nm, and from 230 nm to 270 nm, respectively.

Figure 2F:
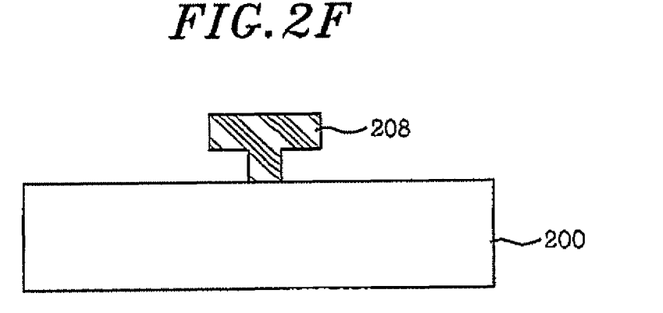

Finally, the first resist 202, the second resist 204 and the third resist 206, in which the T-gate 208 is formed, remaining on the semiconductor substrate 200 are removed by an ashing process using Ar and $O_2$ to form the T-gate 208 on the semiconductor substrate 200, as shown in FIG. 2F.

Accordingly, in a process of forming transistors of semiconductor devices, T-gates having a relatively wide gate head and a relatively narrow gate foot can be formed through the first and the second exposure process by using the electron beam.

Figure 3A:
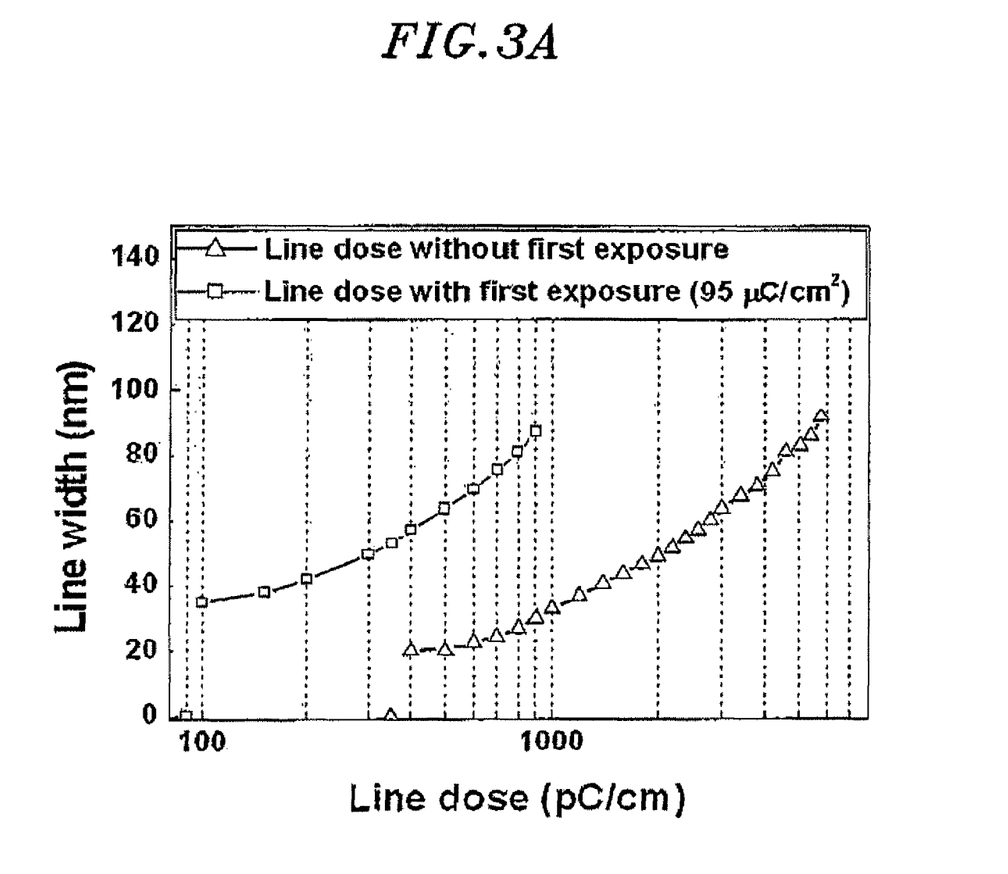
FIGS. 3A and 3B are graphs showing the characteristics of a gate developed at a room temperature according to the conventional method and at a low temperature in accordance with the present invention, respectively.
Figure 3B:
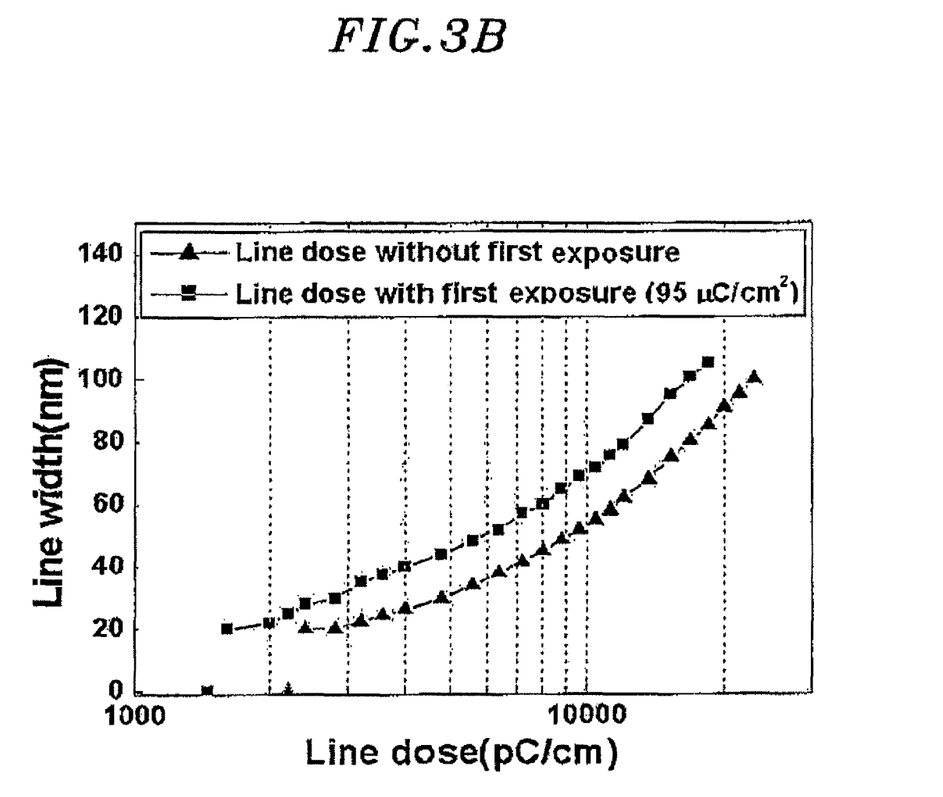

FIGS. 3A and 3B are graphs showing the characteristics of a gate developed at a room temperature according to the conventional method and at a low temperature development in accordance with the present invention, respectively, and further show how the exposure process for the T-gate head part has an effect on the formation of the gate foot. That is, each of the graphs shows a comparison result of irradiating the electron beam for the exposure process of both the gate head part and the gate foot part and irradiating the electron beam only for the exposure process of the gate foot part, while coating only the PMMA resist. To be specific, FIGS. 3A and 3B illustrate the comparison results in the cases of developing at a room temperature 20° C. and at a low temperature −20° C., respectively, for about 30 seconds by using a developing solution with a ratio of MIBK:IPA being 1:3.

As a result of such comparison, in case of the room temperature development shown in FIG. 3A, it is noted that the minimum gate line width which can be implemented is about 35 nm at 100 pC/cm and it is not completely developed at 90 pC/cm on condition that there is an effect from the exposure process of the gate head part, whereas it is also noted that the minimum gate line width which can be implemented is about 20 nm at 400 pC/cm and it is not completely developed at 360 pC/cm on condition that there is no effect from the exposure process of the gate head part. That is, in case of developing at the room temperature, the minimum gate line width which can be implemented becomes 20 nm to 35 nm by the effect from the exposure process of the gate head part. Accordingly, it can be noted that the room temperature development is not suitable for implementing a small gate.

On the other hand, in case of the low temperature development as shown in FIG. 3B, it is noted that the minimum gate line width which can be implemented is about 20 nm at 1,600 pC/cm on condition that there is an effect from the exposure process of the gate head part, whereas it is also noted that the minimum gate line width which can be implemented is about 20 nm at 2400 pC/cm on condition that there is no effect from the exposure process of the gate head part. That is, in case of developing at the low temperature, the minimum gate line width which can be implemented does not change by the effect from the exposure process of the gate head part. Therefore, it can be noted that the low temperature development is suitable for implementing a small gate because the effect from the exposure process of the gate head part can be prevented.

Accordingly, the finer gate can be formed by developing at a low temperature after performing the first and the second exposure processes which use the electron beam.

FIGS. 4A to 4E show the examples of the gate foot formed of a bent shape in accordance with the present invention.

Figure 4A:
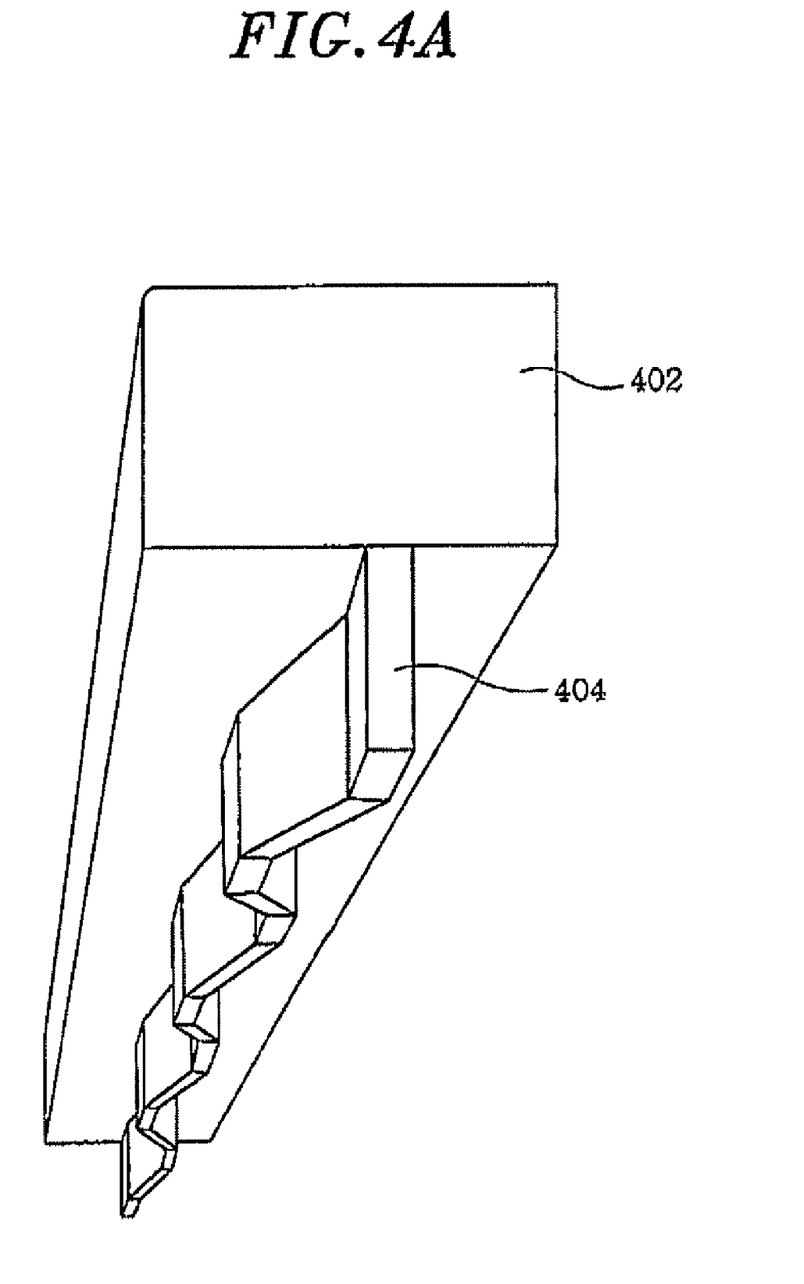
FIGS. 4A to 4E show examples of a gate foot formed of a bent shape in accordance with the present invention.
Figure 4B:
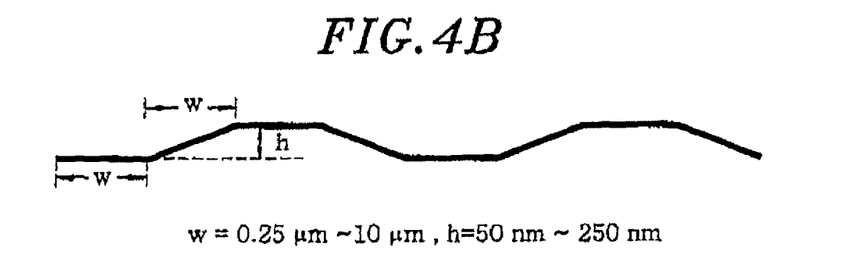
Figure 4C:
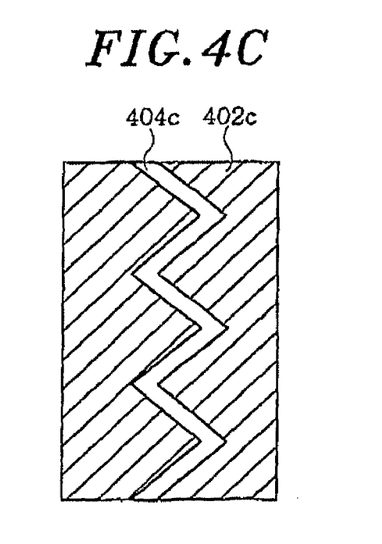
Figure 4D:
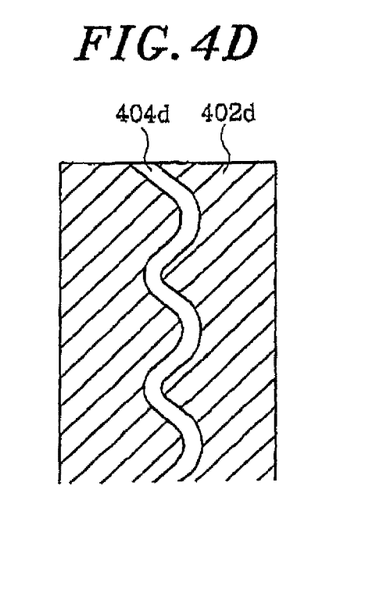

Referring to FIGS. 4A to 4E, in forming the T-gate having a relatively wide gate head 402 and a relatively narrow gate foot 404, in accordance with an embodiment of the present invention, the transversal cross section of the gate foot 404 can be of a bent shape, for example, a patterned shape having trapezoids, where each trapezoid is connected to its two adjacent trapezoids without the base lines, as shown in FIG. 4A. Here, regarding the pattern formation according to the bent shape, it is preferable to set a length of h to be from 50 nm to 250 nm and a length of w to be from 0.25 µm to 10 µm as shown in FIG. 4B. In accordance with another embodiment of the gate foot 404c supporting the gate head 402c shown in FIG. 4C, the transversal cross section of the gate foot 404c can be of a patterned shape having alternating sharp bends at each apex. On the other hand, in accordance with still another embodiment of the gate foot 404d supporting the gate head 402d shown in FIG. 4D, the transversal cross section of the gate foot 404d can be of a patterned shape having curved bends alternating right and left.

Figure 4E:
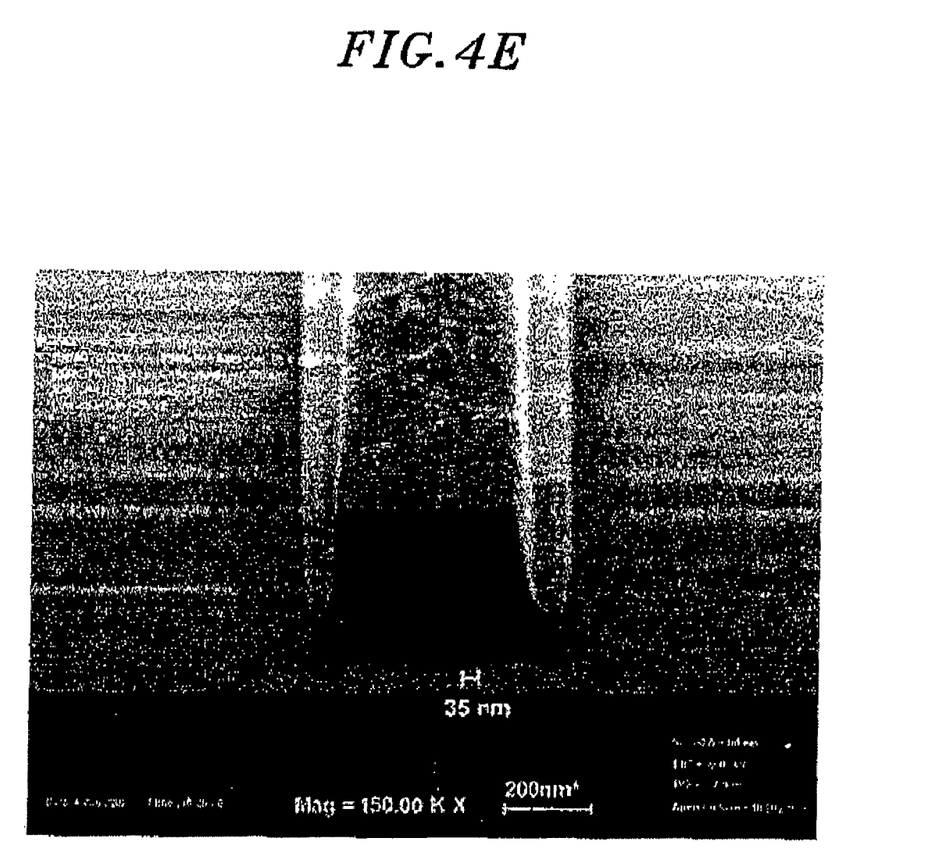

Further, FIG. 4E shows an image, taken by an electron microscope, showing a production result of the gate head 402 and the gate foot 404 of FIG. 4A. As shown in FIG. 4E, since the bent gate foot 404 capable of stably supporting the gate head 402 with a relatively wide width can be formed, a stable schottky contact of the T-gate can be implemented after depositing the metals and removing the resists even if the gate foot 404 is formed to have the width of approximately 35 nm.

Especially, as can be seen by comparing the T-gate having the conventional straight gate foot and the T-gate having the bent gate foot in accordance with the present invention by referring to FIGS. 1B and 4E, the T-gate with the conventional straight gate foot falls to one side if the width of the gate foot is about 35 nm as shown in FIG. 1B, whereas in case of forming the T-gate having the gate foot of a bent shape in accordance with the present invention (for example, the patterned shape having trapezoids, where each trapezoid is connected to its adjacent trapezoids without the base lines; the patterned shape having alternating sharp bends at each apex; and the patterned shape having curved bends alternating right and left), the T-gate is stably formed not to fall to one side even if the width of the gate foot is about 35 nm as shown in FIG. 4E.

Figure 5:
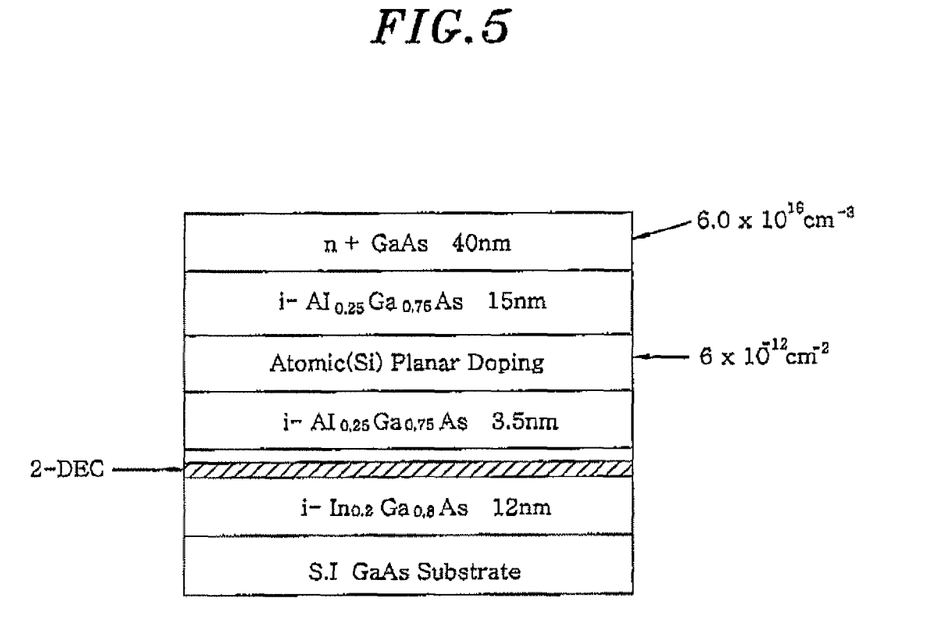
FIG. 5 shows an epitaxial structure used in manufacturing a high electron mobility transistor in accordance with the present invention.

FIG. 5 shows an epitaxial structure used in manufacturing a high electron mobility transistor in accordance with the present invention. Here, an $In_{0.2}Ga_{0.8}As$ layer of approximately 12 nm in thickness, an $Al_{0.25}Ga_{0.75}AS$ layer of approximately 3.5 nm in thickness, a silicon delta-doping layer, an $Al_{0.25}Ga_{0.75}AS$ layer of approximately 15 nm in thickness, and an $n^+GaAS$ layer of about 40 nm in thickness are deposited sequentially on a GaAs substrate. After performing mesa etching on such structure for about 30 seconds by using a solution with a ratio of $H_3PO_4:H_2O_2:H_2O$ being 1:1:25 in order to define an active region for forming the transistor, AuGe, Ni, and Au are deposited thereon to have the thickness of approximately 100 nm, 30 nm, and 300 nm, respectively. Sequentially, by performing a thermal process at a temperature of about 430° C. thereto, an ohmic contact layer is formed to form a source region and a drain region.

After that, the T-gate is formed on the semiconductor substrate where both the source region and the drain region are formed by using the electron beam in accordance with the present invention, and then a gate recess is performed by using an etching solution based on citric acids.

Figure 6:
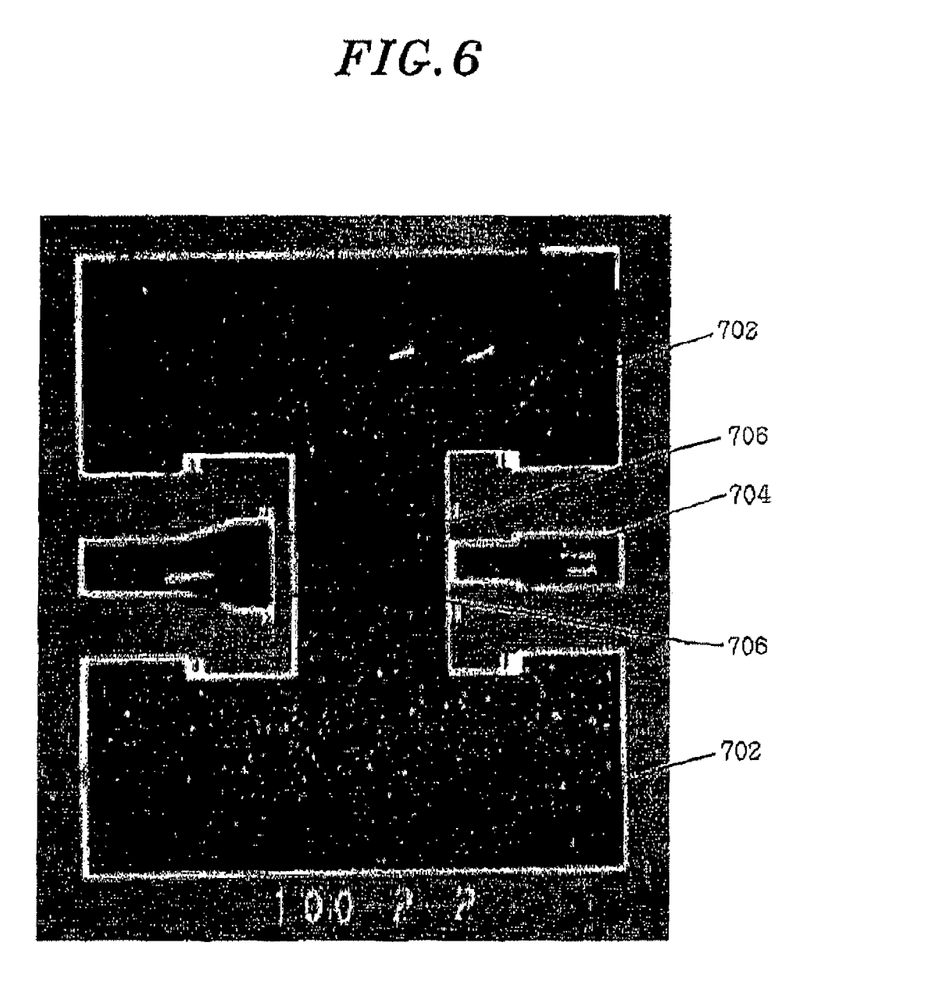
FIG. 6 shows a high electron mobility transistor having a T-gate, a source and a drain in accordance with the present invention.

Further, FIG. 6 shows a high electron mobility transistor having a T-gate, a source and a drain in accordance with the present invention, which is taken by an electron microscope. Here, reference numeral 702 indicates the source of the high electron mobility transistor and reference numeral 704 represents the drain of the high electron mobility transistor while reference numeral 706 presents the gate of the high electron mobility transistor. It is noted that the T-gate with a gate foot of a bent shape is located between the source region and the drain region.

Figure 7A:
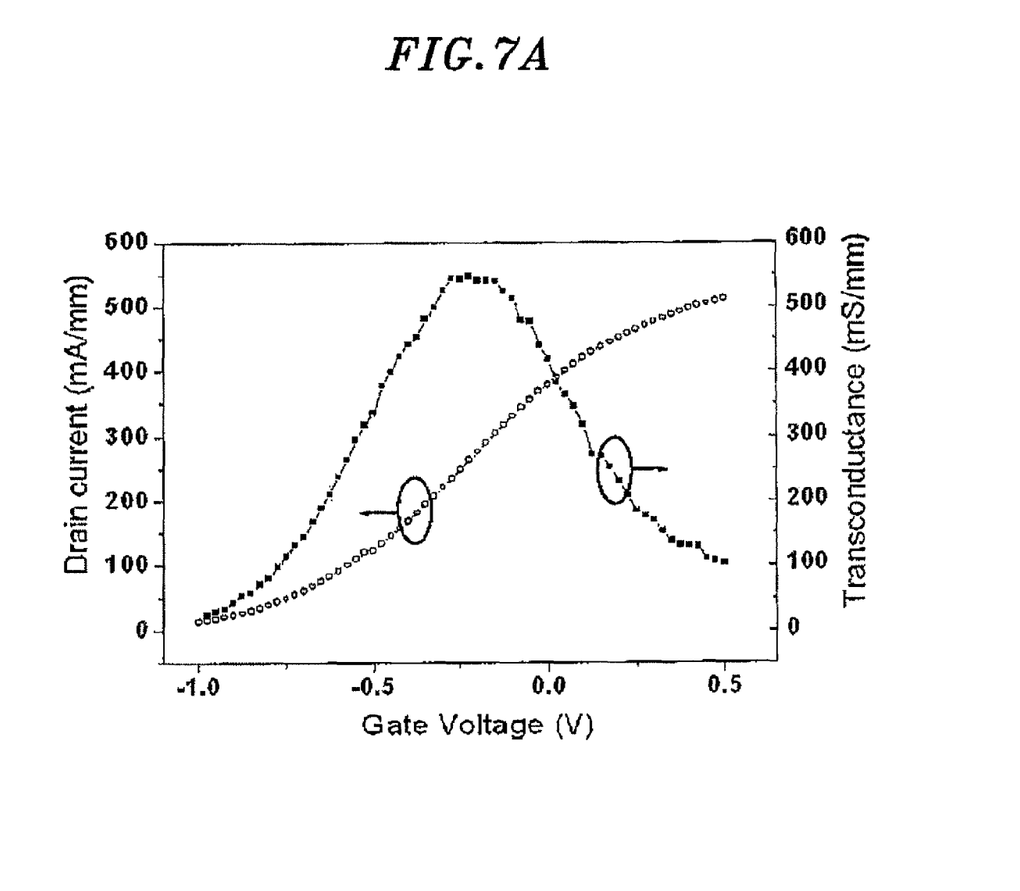
FIG. 7A shows the result of measuring the DC characteristics of a high electron mobility transistor fabricated according to the present invention.
Figure 7B:
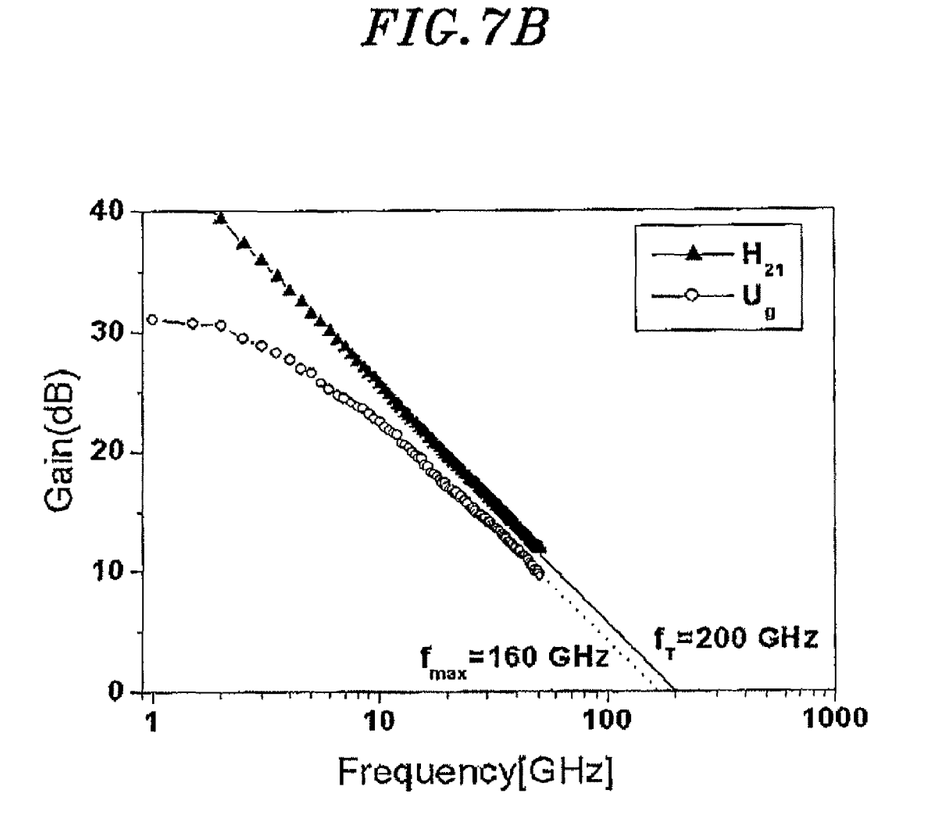
FIG. 7B shows the result of measuring the ultrahigh frequency characteristics of the high electron mobility transistor fabricated in accordance with the present invention.

On the other hand, FIG. 7A shows the result of measuring the DC characteristics of the high electron mobility transistor fabricated according to the present invention while FIG. 7B shows the result of measuring the ultrahigh frequency characteristics thereof. As shown in FIG. 7A, the high electron mobility transistor fabricated according to the present invention has a maximum DC gain of about 560 mS/mm, whereas a current gain cutoff frequency and a maximum oscillating frequency $f_{max}$ thereof are about 200 GHz and about 160 GHz, respectively, as shown in FIG. 7B. Accordingly, it is noted that a high electron mobility transistor with the excellent characteristics can be fabricated.

Therefore, if high electron mobility transistors including a T-gate with a bent gate foot are fabricated through the first and the second exposure processes by using the electron beam in accordance with the present invention, transistors with a T-gate having a size of tens of nanometers can be stably formed.

In accordance with the present invention, a first, a second and a third resist are coated on a semiconductor substrate, wherein each resist has an electron beam sensitivity different from each other. On the semiconductor substrate where the first, the second and the third resist are coated, a first exposure process using an electron beam is performed, and then the third resist is selectively developed. Thereafter, the second resist is selectively developed to have a developed width wider than that of the third resist in order to define a gate head area. On the semiconductor substrate where the third and the second resist are selectively developed, a second exposure process is performed by using an electron beam, and then the first resist is selectively developed in a bent shape at a temperature lower than in the development of the second and the third resist. Finally, after depositing metallic materials on the first, the second and the third resist which are selectively developed, the first, the second and the third resist are removed to form a T-gate with the gate head and a gate foot. Accordingly, by means of performing the first and the second exposure process by using an electron beam and developing each of the resists by using a developing solution different from each other at a temperature different from each other, a stable T-gate with a bent-shaped gate foot can be fabricated.

While the invention has been shown and described with respect to the preferred embodiments, it will be understood by those skilled in the art that various changes and modifications may be made without departing from the scope of the invention as defined in the following claims.

What is claimed is:

1. A gate structure of a high electron mobility transistor, the gate structure comprising:
    a gate foot formed on a semiconductor substrate; and
    a gate head, with a width wider than the gate foot, formed on the gate foot,
    wherein a transversal cross section of the gate foot is of a bent shape.

2. The gate structure of claim 1, wherein the transversal cross section of the bent shape is of a patterned shape having trapezoids, where each trapezoid is connected to its two adjacent trapezoids without the base lines.

3. The gate structure of claim 1, wherein the transversal cross section of the bent shape is of a patterned shape having alternating sharp bends at each apex.

4. The gate structure of claim 1, wherein the transversal cross section of the bent shape is of a patterned shape having curved bends alternating right and left.

* * * * *